(12) United States Patent
Yin et al.

(10) Patent No.: US 7,772,673 B1
(45) Date of Patent: Aug. 10, 2010

(54) DEEP TRENCH ISOLATION AND METHOD FOR FORMING SAME

(75) Inventors: Kevin Q. Yin, Irvine, CA (US); Amol Kalburge, Irvine, CA (US); David J. Howard, Irvine, CA (US); Arjun Kar-Roy, Irvine, CA (US); Dieter Dornisch, Carlsbad, CA (US)

(73) Assignee: Newport Fab, LLC, Newport Beach, CA (US)

( * ) Notice: Subject to any disclaimer, the term of this patent is extended or adjusted under 35 U.S.C. 154(b) by 469 days.

(21) Appl. No.: 11/724,916

(22) Filed: Mar. 16, 2007

(51) Int. Cl.
  *H01L 21/04* (2006.01)
(52) U.S. Cl. ............... 257/510; 257/520; 257/E27.001
(58) Field of Classification Search ............... 257/510, 257/520, E27.001
  See application file for complete search history.

(56) References Cited

U.S. PATENT DOCUMENTS 5,933,749 A * 8/1999 Lee ........................... 438/435
6,107,161 A * 8/2000 Kitaguro et al. ............. 438/462

* cited by examiner

*Primary Examiner*—Jack Chen
(74) *Attorney, Agent, or Firm*—Farjami & Farjami LLP (57) ABSTRACT

According to one exemplary embodiment, a semiconductor die including at least one deep trench isolation region for isolating an electronic device (for example, a bipolar device) includes a trench situated in a substrate of the semiconductor die, where the trench has sides surrounding the electronic device, and where the trench has at least one trench chamfered corner formed between and connecting the sides of the trench. The at least one trench chamferred corner is formed between a chamfered corner of an outside wall of said trench and a corner of an inside wall of the trench. A trench corner width at the at least one trench chamfered corner is less than a trench side width along the sides of the trench.

17 Claims, 9 Drawing Sheets

DEEP TRENCH ISOLATION AND METHOD FOR FORMING SAME

BACKGROUND OF THE INVENTION

1. Field of the Invention

The present invention is generally in the field of semiconductor fabrication. More particularly, the invention is in the field of isolation region formation in semiconductor substrates.

2. Background Art

Deep trench isolation regions can be formed to provide electrical isolation for electronic devices in a semiconductor die, such as, for example, electrical isolation for bipolar devices in a semiconductor die, where the die includes both bipolar and Complementary-Metal-Oxide-Semiconductor (CMOS) devices. A deep trench isolation region may also electrically isolate a bipolar transistor (i.e. a bipolar device) from adjacent bipolar transistors fabricated on the same semiconductor substrate. A deep trench isolation region can also be utilized, for example, to electrically isolate a collector of a bipolar transistor from neighboring regions of the substrate, thereby reducing collector-to-substrate capacitance. Deep trench isolation regions may be formed on a substrate after formation of, for example, field oxide isolation regions, a buried layer, and an epitaxial layer of silicon.

In a conventional deep trench isolation process flow, a trench can be formed in a semiconductor substrate and sidewalls and bottom surface of the trench can be lined with an oxide liner. A conformal layer of polycrystalline silicon (also referred to as polysilicon) can be deposited over the substrate so as to fill the trench. However, for a rectangular-shaped trench, a thick layer of polysilicon can be required to adequately fill the trench with polysilicon. However, depositing a thick layer of polysilicon can significantly reduce polysilicon fill process throughput and require more frequent deposition furnace cleaning as a result of increased polysilicon flaking, thereby increasing manufacturing cost.

Thus, there is a need in the art for providing an improved deep trench isolation process and region in a semiconductor substrate to, for example, increase throughput and reduce manufacturing cost.

SUMMARY OF THE INVENTION

Deep trench isolation and method for forming same substantially as shown in and/or described in connection with at least one of the figures, as set forth more completely in the claims.

DETAILED DESCRIPTION OF THE INVENTION

The present invention is directed to deep trench isolation and method for forming same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
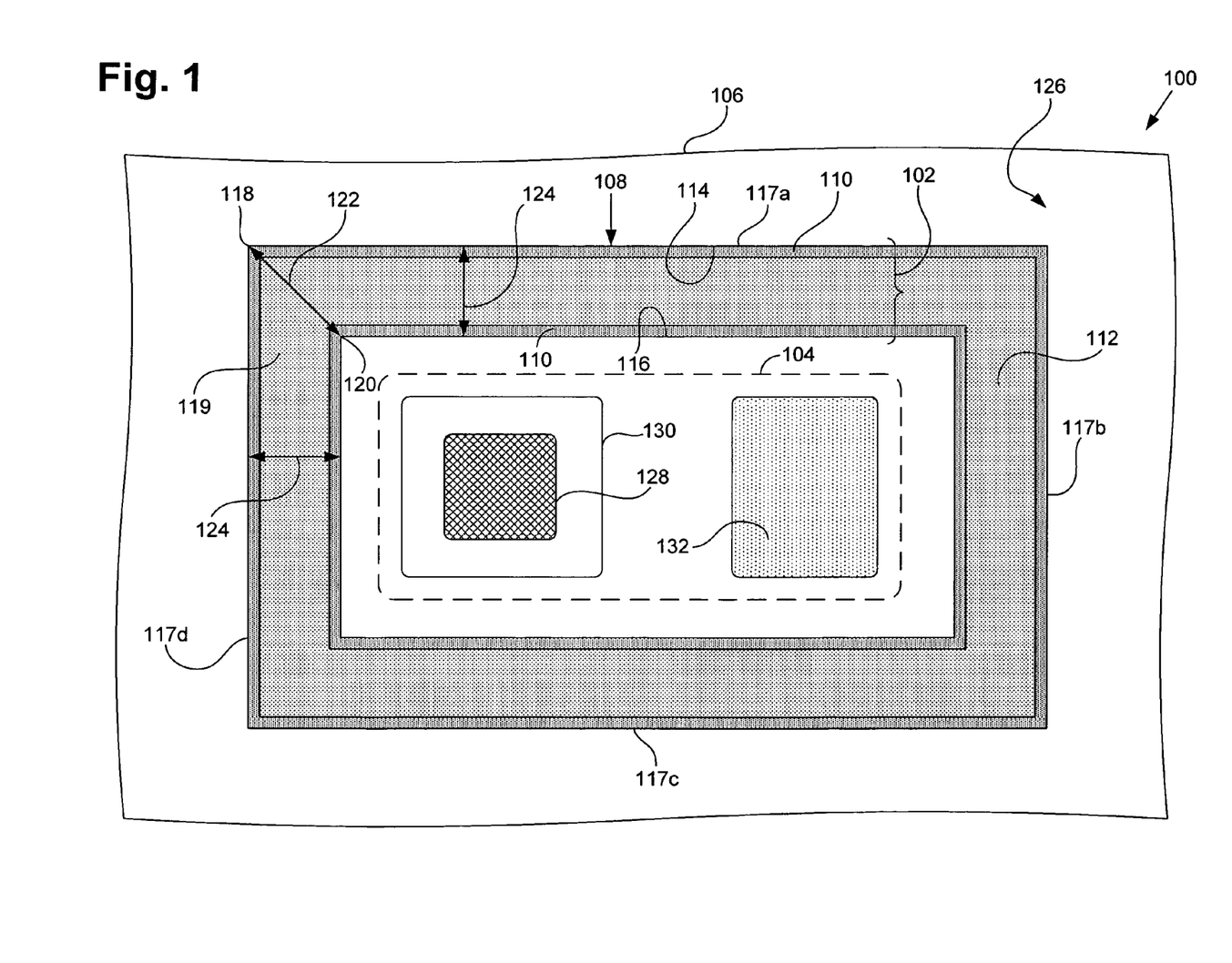
FIG. 1 shows a top view of an exemplary conventional deep trench isolation region in a semiconductor die.

It is noted that although a bipolar device is utilized as an example of an electronic device to illustrate the present invention, the invention's deep trench isolation region can be utilized to isolated electronic devices other than bipolar devices. FIG. 1 shows a top view of structure 100, which includes conventional deep trench isolation region 102 and bipolar device 104. Structure 100, which can be a portion of a semiconductor die, also includes substrate 106, which can be a silicon substrate. Conventional deep trench isolation region 102 includes trench 108, oxide liner 110, and polysilicon filling 112 and bipolar device 104 includes emitter 128, which is situated over active region 130 and collector 132. Structure 100 can include a field oxide region overlying conventional deep trench isolation region 102 and a field oxide region separating active region 130 from collector 132, which are not shown in FIG. 1 to simplify illustration of conventional deep trench isolation region 102. Structure 100 can also include a number of adjacent deep trench isolation regions surrounding respective bipolar devices, which are not shown in FIG. 1 to preserve brevity.

As shown in FIG. 1, bipolar device 104, which is enclosed by conventional deep trench isolation region 102, includes emitter 128, which is situated over active region 130, and collector 132. Bipolar device 104 also includes a base (not shown in FIG. 1), which is situated under emitter 128. For example, bipolar device 104 can be a vertical bipolar transistor, such as a vertical NPN or PNP transistor. Bipolar device 104 can be formed on an epitaxial layer (not shown in FIG. 1), which can be formed over substrate 106. The epitaxial layer (not shown in FIG. 1) can overlie a buried layer (also not shown in FIG. 1), which can be formed in substrate 106. Bipolar device 104, which can be fabricated in a manner known in the art, is isolated by conventional deep trench isolation region 102 from surrounding bipolar devices situated on substrate 106. Conventional deep trench isolation region 102 also reduces collector-to-substrate capacitance by isolating collector 132 of bipolar device 104 from the neighboring substrate.

Also shown in FIG. 1, trench 108 is situated in substrate 106 and has outside wall 114, which has corners 118, inside wall 116, which has corners 120, and sides 117a, 117b, 117c, and 117d (hereinafter "sides 117a through 117d"). Trench 108 has a rectangular shape, wherein each of corners 118 of outside wall 114 and corners 120 of inside wall 116 form a right angle. Trench 108 has trench corner width 122, which represents the perpendicular distance, i.e., the minimum distance, between corners 118 of outside wall 114 and corners 120 of inside wall 116, and trench side width 124, which represents the perpendicular distance between outside wall 114 and inside wall 116 along each of sides 117a through 117d. For example, trench corner width 122 can be approximately 1.4 microns and trench side width 124 can be approximately 1.0 micron. Trench 108 can have a depth of, for example, approximately 7.0 microns. The distance between opposite sides 117a and 117c of trench 108 can be, for example, approximately 3.0 microns and the distance between opposite sides 117b and 117d can be, for example, approximately 5.0 microns. Trench 108 can be formed by utilizing a suitable mask and etch process as is known in the art.

Also shown in FIG. 1, oxide liner 110 is situated on outside and inside walls 114 and 116 and bottom surface (not shown in FIG. 1) of trench 108 and can comprise silicon oxide, which can be thermally grown in trench 108. For example, oxide liner 110 can have a thickness of approximately 1000.0 Angstroms. Further shown in FIG. 1, polysilicon filling 112 is situated in trench 108 and can be formed by conformally depositing a layer of polysilicon (polycrystalline silicon) over top surface 126 of substrate 106. In order to sufficiently fill corner regions 119 of trench 108 with polysilicon, the thickness of the deposited polysilicon layer can be approximately 1.5 microns for a trench side width (i.e. trench side width 124) of approximately 1.0 micron. However, depositing an approximate 1.5 micron thick layer of polysilicon requires a long cycle time, which significantly reduces polysilicon fill process throughput and, thereby, increases manufacturing cost. Also, a polysilicon deposition thickness of approximately 1.5 microns can cause a significant amount of polysilicon flaking, which correspondingly increases the amount of polysilicon particles in the deposition furnace. As a result, the deposition furnace requires more frequent cleaning, which also increases manufacturing cost.

Figure 2:
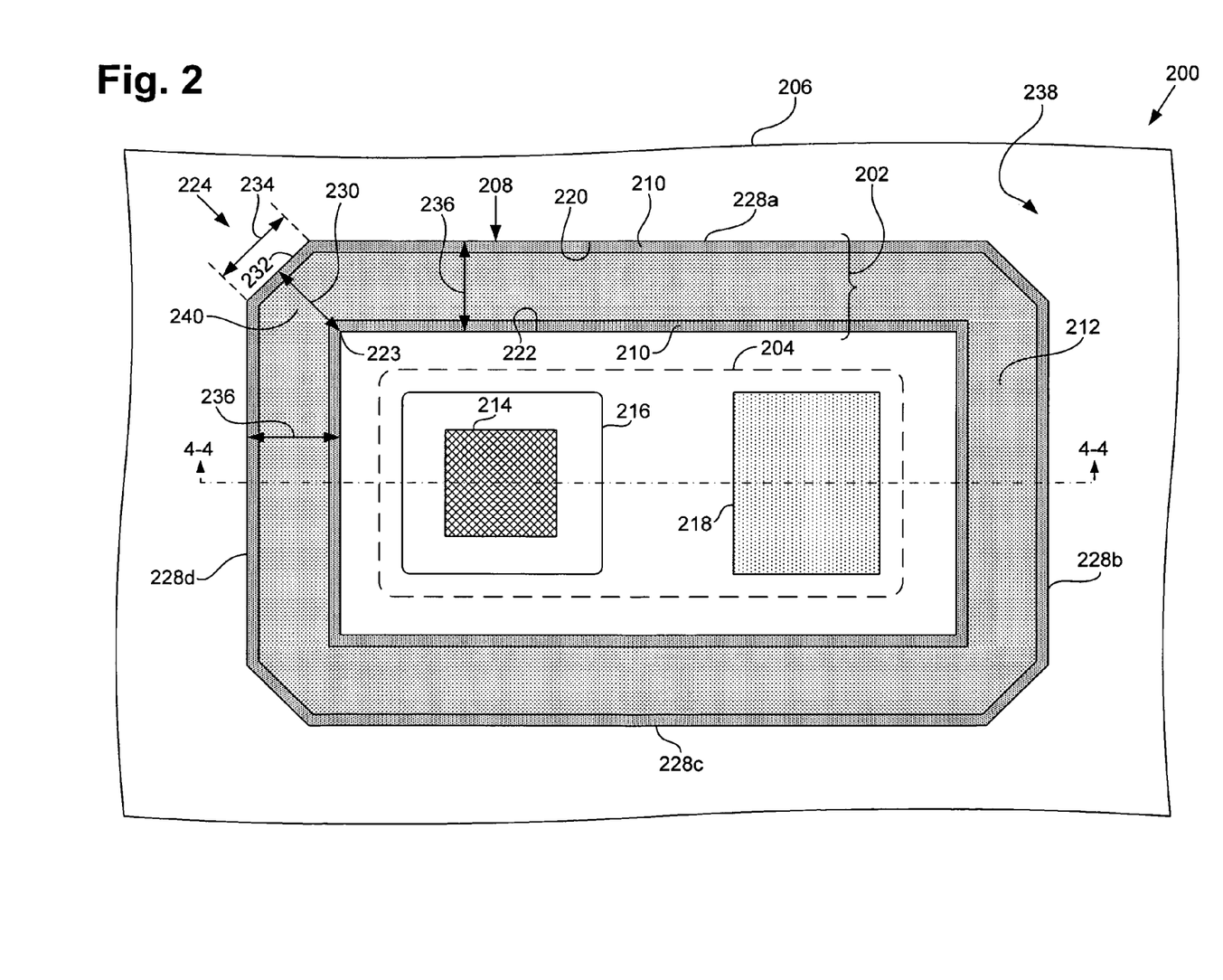
FIG. 2 shows a top view of an exemplary deep trench isolation region in a semiconductor die in accordance with one embodiment of the present invention.

It is again noted that although a bipolar device (i.e. a bipolar transistor) is utilized as an example of an electronic device to illustrate the present invention, the invention's deep trench isolation region can be utilized to isolated electronic devices other than bipolar devices. FIG. 2 shows a top view of structure 200 including deep trench isolation region 202, in accordance with one embodiment of the present invention. Structure 200, which can be a portion of a semiconductor die, also includes bipolar device 204 and substrate 206, which can be a silicon substrate. Deep trench isolation region 202 includes trench 208, oxide liner 210, and polysilicon filling 212 and bipolar device 204 includes emitter 214, which is situated over active region 216, and collector 218. Structure 200 can include a field oxide region overlying deep trench isolation region 202 and a field oxide region separating active region 216 from collector 218, which are not shown in FIG. 2 to simply illustration of the invention. Structure 200 can also include a number of adjacent deep trench isolation regions surrounding respective bipolar devices, which are not shown in FIG. 2 to preserve brevity.

As shown in FIG. 2, bipolar device 204, which is enclosed by deep trench isolation region 202, includes emitter 214, which is situated over active region 216, collector 218, and a base (not shown in FIG. 2), which is situated under emitter 214. For example, bipolar device 204 can be a vertical bipolar transistor, such as a vertical NPN or PNP transistor. In one embodiment, bipolar device 204 can be a vertical silicon-germanium (SiGe) bipolar transistor, such as a vertical NPN SiGe transistor. Bipolar device 204 can be formed in a manner known in the art on an epitaxial layer (not shown in FIG. 2), which can be formed over substrate 206. The epitaxial layer (not shown in FIG. 2) can overlie a buried layer (also not shown in FIG. 2), which can be formed in substrate 206. Bipolar device 204 is isolated by deep trench isolation region 202 from surrounding bipolar devices situated on substrate 206. Deep trench isolation region 202 reduces collector-to-substrate capacitance by isolating collector 218 of bipolar device 204 from the neighboring substrate, i.e., portions of substrate 206 situated outside of deep trench isolation region 202.

Also shown in FIG. 2, trench 208 is situated in substrate 206 and has outside wall 220, which has chamfered corners 224, inside wall 222, which has corners 223, and sides 228a, 228b, 228c, and 228d (hereinafter "sides 228a through 228d"). Further shown in FIG. 2, trench chamfered corners 240 are formed between and connecting sides 228a through 228d. Trench chamfered corners 240 are also formed between chamfered corners 224 of outside wall 220 and corners 223 of inside wall 222 of trench 208. In the present invention, trench chamfered corners 240 significantly reduce trench corner width 230, which represents the perpendicular distance, i.e., the minimum distance, between chamfered edge 232 and each of corners 223 of inside wall 222 of trench 208.

Trench corner width 230 can be determined by appropriately selecting length 234 of chamfered edge 232 at chamfered corners 224 of outside wall 220. In the present embodiment, length 234 of chamfered edge 232 can be selected such that trench corner width 230 is less than trench side width 236, which represents the perpendicular distance, i.e., the minimum distance, between outside wall 220 and inside wall 222 along each of sides 226a through 226d of trench 208. For example, for a trench side width of approximately 1.0 micron, trench corner width 230 can be approximately 0.9 microns. In one embodiment, trench corner width 230 can be less than or equal to trench side width 236. Chamfered edge 232 can form equal angles with respect to adjacent sides of trench 208, such as sides 228a and 228d. In another embodiment, chamfered edge 232 may form a different angle with respect to each adjacent side of trench 208. Each of corners 223 of inside wall 222 of trench 208 can form, for example, an approximate right angle.

Trench 208 can have a size of, for example, 3.0 microns by 5.0 microns, which corresponds to the respective distances between opposite sides of trench 208. For example, the distance between opposite sides 228a and 228c of trench 208 can be approximately 3.0 microns. For example, the distance between opposite sides 228d and 228b of trench 208 can be approximately 5.0 microns. Trench 208 can have a depth of, for example, approximately 7.0 microns.

Further shown in FIG. 2, oxide liner 210 is situated on outer and inner walls 220 and 222 and a bottom surface (not shown in FIG. 2) of trench 208 and can comprise thermal oxide. For example, oxide liner 210 can have a thickness of approximately 1000.0 Angstroms. Also shown in FIG. 2, polysilicon (i.e. polycrystalline silicon) filling 212 is situated on oxide liner 210 and fills trench 208. Polysilicon filling 212 can be formed by conformally depositing a layer of polysilicon over top surface 238 of substrate 206. In order to sufficiently fill trench 208, the thickness of the deposited polysilicon layer can be approximately 0.7 microns for a trench side width (i.e. trench side width 236) of approximately 1.0 micron, a trench corner width (i.e. trench corner width 230) of approximately 0.9 microns, and a depth of approximately 7.0. In contrast, a deposited polysilicon layer thickness of approximately 1.5 microns is required to fill trench 108 in conventional deep trench isolation region 102, which has a trench corner width of approximately 1.4 microns and a substantially similar trench side width and depth as trench 208.

Thus, by forming trench chamfered corners 240 to reduce the trench corner width to approximately 0.9 microns compared to a trench corner width of approximately 1.4 microns for conventional trench 108, an embodiment of the present invention advantageously reduces the deposited polysilicon layer thickness from approximately 1.5 microns to approximately 0.7 microns. Since deposited polysilicon layer thickness is reduced by approximately one half, the present embodiment can increase polysilicon fill process throughput for trench 208 by approximately 100 percent compared to the polysilicon fill process throughput for conventional trench 108 in FIG. 1. Also, since the invention significantly reduces the deposited polysilicon layer thickness, polysilicon flaking is significantly reduced, thereby significantly increasing the average time between consecutive polysilicon deposition furnace cleanings.

Thus, by forming trench chamfered corners to reduce trench corner width by approximately 40 percent, e.g., from approximately 1.4 microns to approximately 0.9 microns, the invention significantly increases polysilicon fill process throughput and also significantly increases the average time between polysilicon deposition furnace cleaning. As a result, the present invention advantageously reduces manufacturing cost. The fabrication of the invention's deep trench isolation region, such as deep trench isolation region 202 in FIG. 2, is further discussed below in relation to FIGS. 3, 4A, 4B, 4C, 4D, 4E, and 4F.

Figure 3:
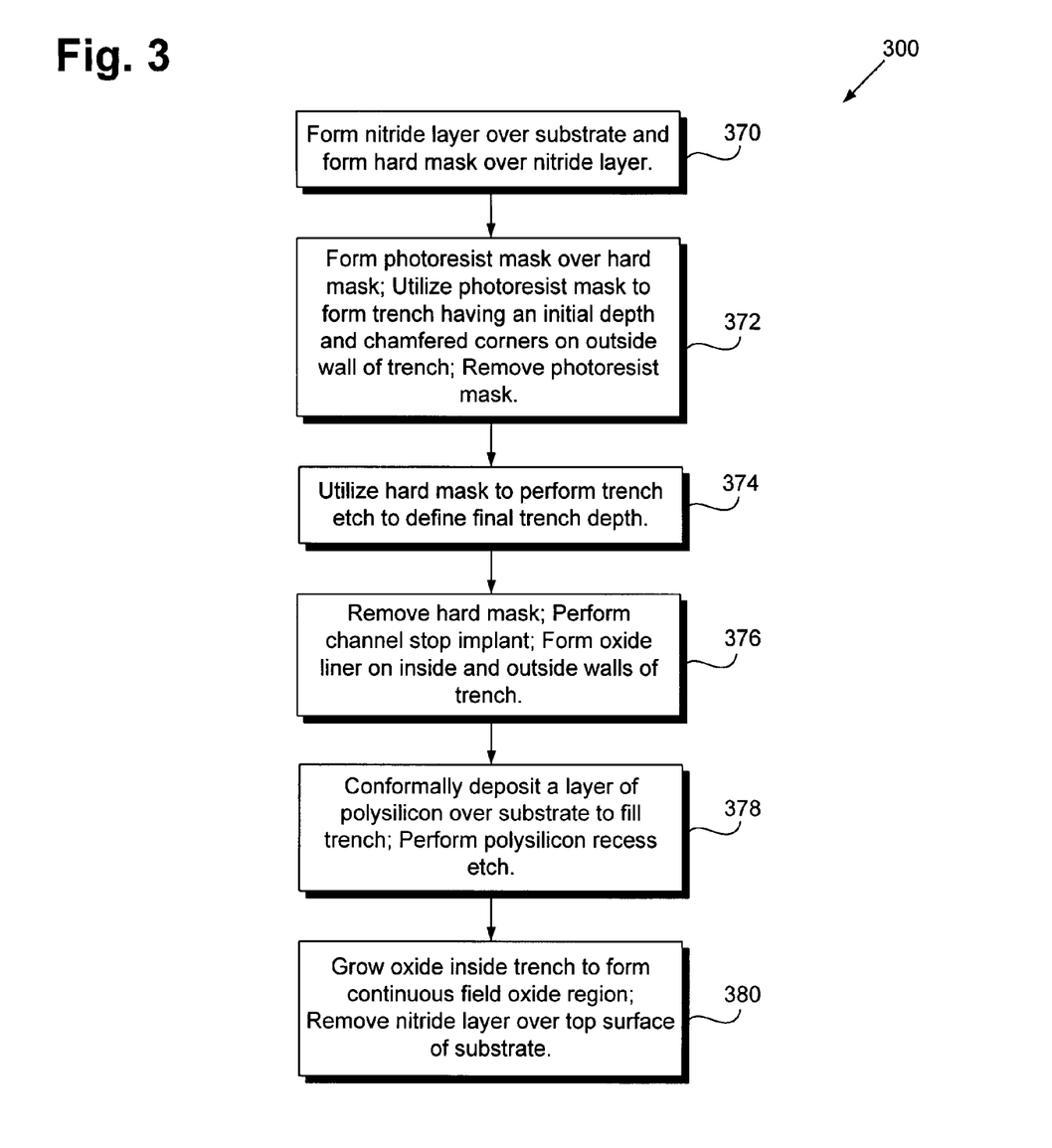
FIG. 3 shows a flowchart illustrating the steps taken to implement an embodiment of the present invention.

FIG. 3 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 370 through 380 indicated in flowchart 300 are sufficient to describe an embodiment of the present invention's deep trench isolation region 202 in FIG. 2; other embodiments of the invention may utilize steps different from those shown in flowchart 300. It is noted that the processing steps shown in flowchart 300 are performed on a wafer, which, prior to step 370, includes field oxide regions, a buried layer, and an epitaxial layer situated over the buried layer. The wafer may be referred to as a semiconductor die or simply a die in the present application.

Moreover, structures 470 through 480 in FIGS. 4A through 4F illustrate the result of performing, on the semiconductor structure discussed above, steps 370 through 380 of flowchart 300, respectively. For example, structure 470 shows the semiconductor structure discussed above after processing step 370, structure 472 shows structure 470 after the processing of step 372, structure 474 shows structure 472 after the processing of step 374, and so forth. It is noted that although formation of only one deep trench isolation region is specifically discussed herein to preserve brevity, multiple deep trench isolation regions can be formed in a substrate, such as substrate 206 in FIG. 2, utilizing the innovative process of the present invention.

Figure 4A:
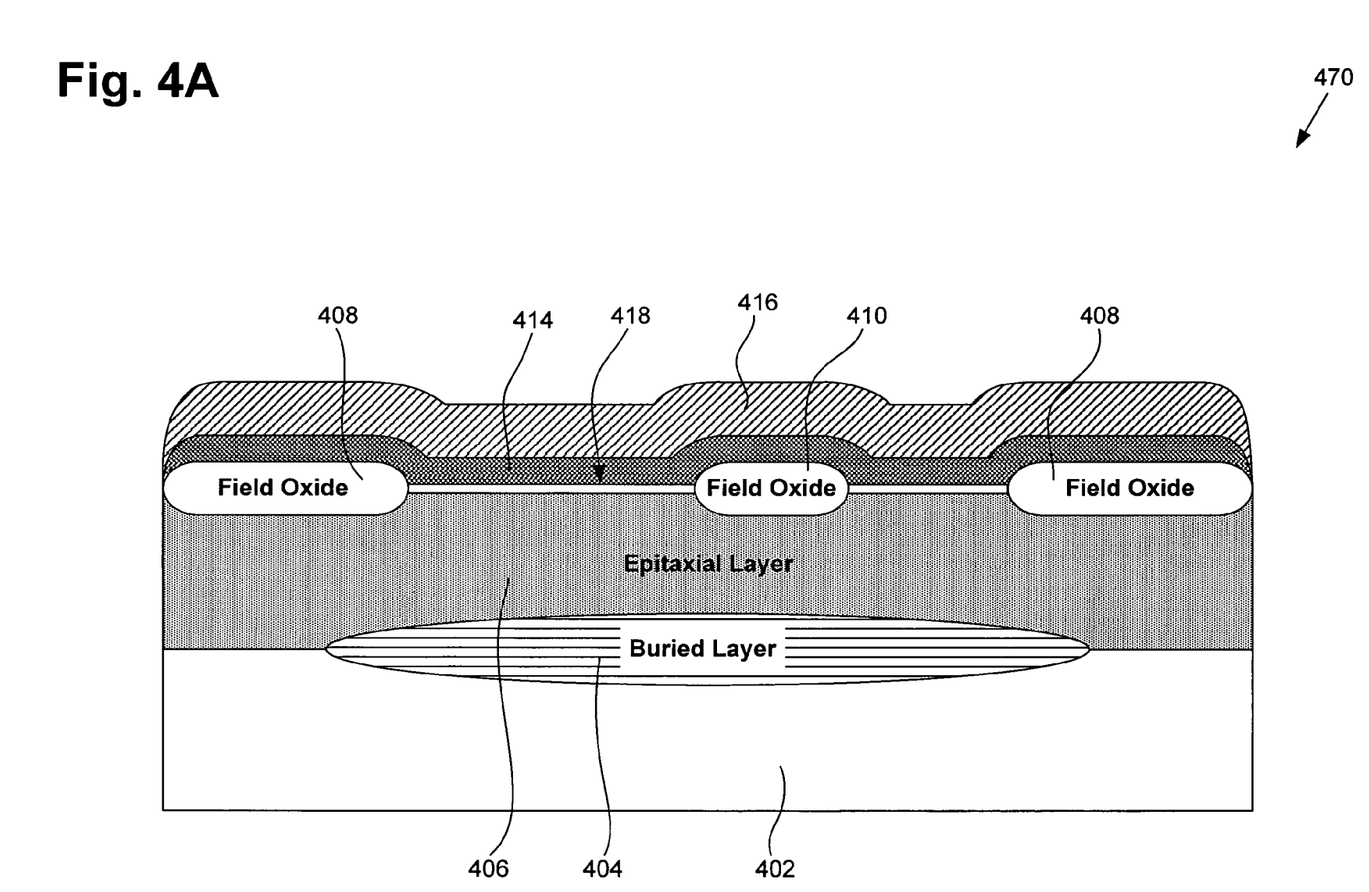
FIG. 4A illustrates a cross-sectional view, which includes a portion of a wafer processed according to an embodiment of the invention, corresponding to an initial step in the flowchart in FIG. 3.

Referring now to FIG. 4A, structure 470 of FIG. 4A shows structure 200 along line 4-4 in FIG. 2 prior to formation of deep trench isolation region 202 and bipolar device 204. Structure 470 also includes field oxide regions, a buried layer, and an epitaxial layer, which are not shown in structure 200 in FIG. 2. In structure 470, buried layer 404, epitaxial layer 406, and field oxide regions 408 and 410 are formed in substrate 402, which corresponds to substrate 206 in structure 200 in FIG. 2. Buried layer 404 is formed in substrate 402 in a manner known in the art and can comprise, for example, heavily doped N-type material. Epitaxial layer 406 can comprise single-crystal silicon, which can be epitaxially grown on substrate 402 in a manner known in the art. Field oxide regions 408 and 410 comprise silicon oxide and may be formed in substrate 402 in a manner known in the art.

Continuing with step 370 in FIG. 3 and structure 470 in FIG. 4A, at step 370 of flowchart 300, silicon nitride ("nitride") layer 414 is deposited on top surface 418 of substrate 402 and hard mask 416 is formed on nitride layer 414. Nitride layer 414 can be formed, for example, by depositing a layer of nitride on top surface 418 of substrate 402 in a low pressure chemical vapor deposition (LPCVD) process and can have a thickness of approximately 1500.0 Angstroms, for example. Hard mask 416 can comprise densified oxide, which can be formed by depositing TEOS oxide on nitride layer 414 in an LPCVD process and densifying the TEOS oxide in a manner known in the art. In one embodiment, hard mask 416 can comprise high-density plasma (HDP) oxide. The thickness of hard mask 416 can be, for example, approximately 4500.0 Angstroms. The result of step 370 of flowchart 300 is illustrated by structure 470 in FIG. 4A.

Figure 4B:
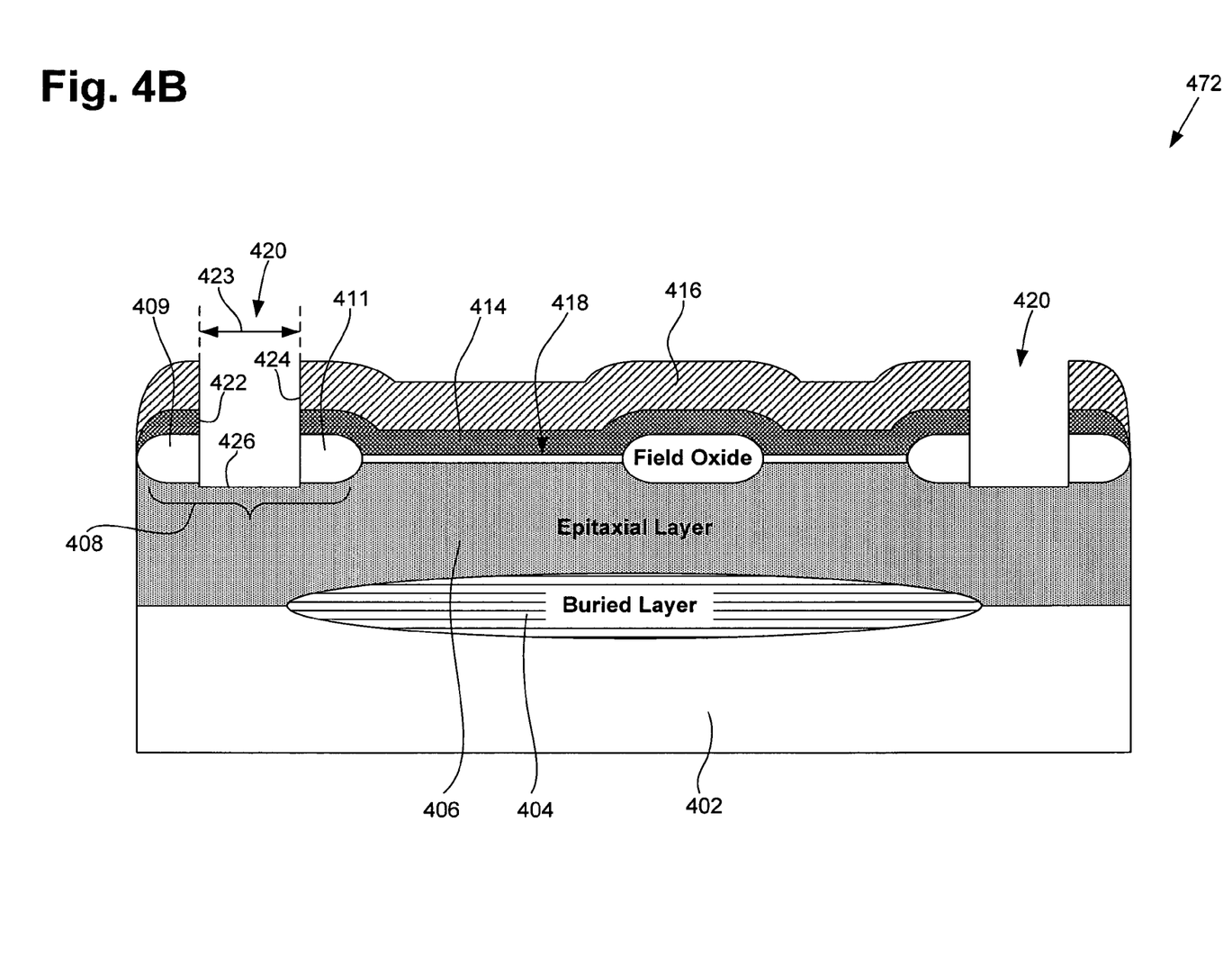
FIG. 4B illustrates a cross-sectional view, which includes a portion of a wafer processed according to an embodiment of the invention, corresponding to an intermediate step in the flowchart in FIG. 3.

Referring to step 372 in FIG. 3 and structure 472 in FIG. 4B, at step 372 of flowchart 300, a photoresist mask is deposited and patterned on hard mask 416. The patterned photoresist mask is utilized to form trench 420 having an initial depth and trench chamfered corners, and the photoresist mask is then removed. Trench 420 corresponds to trench 208 in FIG. 2, which has trench chamfered corners 240 formed between and connecting sides 228a through 228d of trench 208. The photoresist mask can be deposited and patterned on hard mask 416 in a manner known in the art to achieve a trench opening in the photoresist mask having a side width substantially equal to a critical dimension (CD) and a corner width.

In a first etch step, trench 420 can be formed by utilizing an etchant such as CF4/CHF3/Ar or other appropriate etchant and adjusting the etchant chemistry to sequentially etch through hard mask 416, nitride layer 414, field oxide region 408, and etch a short distance into epitaxial layer 406. The resulting trench 420 formed by the etch step discussed above defines outside wall 422, inside wall 424 and bottom surface 426. Outside and inside walls 422 and 424 of trench 420 correspond, respectively, to outside and inside walls 220 and 222 of trench 208 in FIG. 2. Bottom surface 426 of trench 420 can extend into epitaxial layer 406 to an initial depth a short distance below field oxide region 408. Field oxide portions 409 and 411, which are situated adjacent to sidewalls 422 and 424, respectively, are formed as a result of the etch step discussed above.

In a second etch step, the photoresist mask can be removed from hard mask 416 and polymer residue formed as a result of the first etch step discussed above can be removed from outside and inside walls 422 and 424 of trench 420 in a wet strip utilizing an appropriate etchant as known in the art. Trench side width 423 of trench 420, which corresponds to trench side width 236 of trench 208 in FIG. 2, is determined by the CD of the trench opening patterned in the photoresist mask discussed above, and can be, for example, approximately 1.0 micron. The result of step 372 of flowchart 300 is illustrated by structure 472 in FIG. 4B.

Figure 4C:
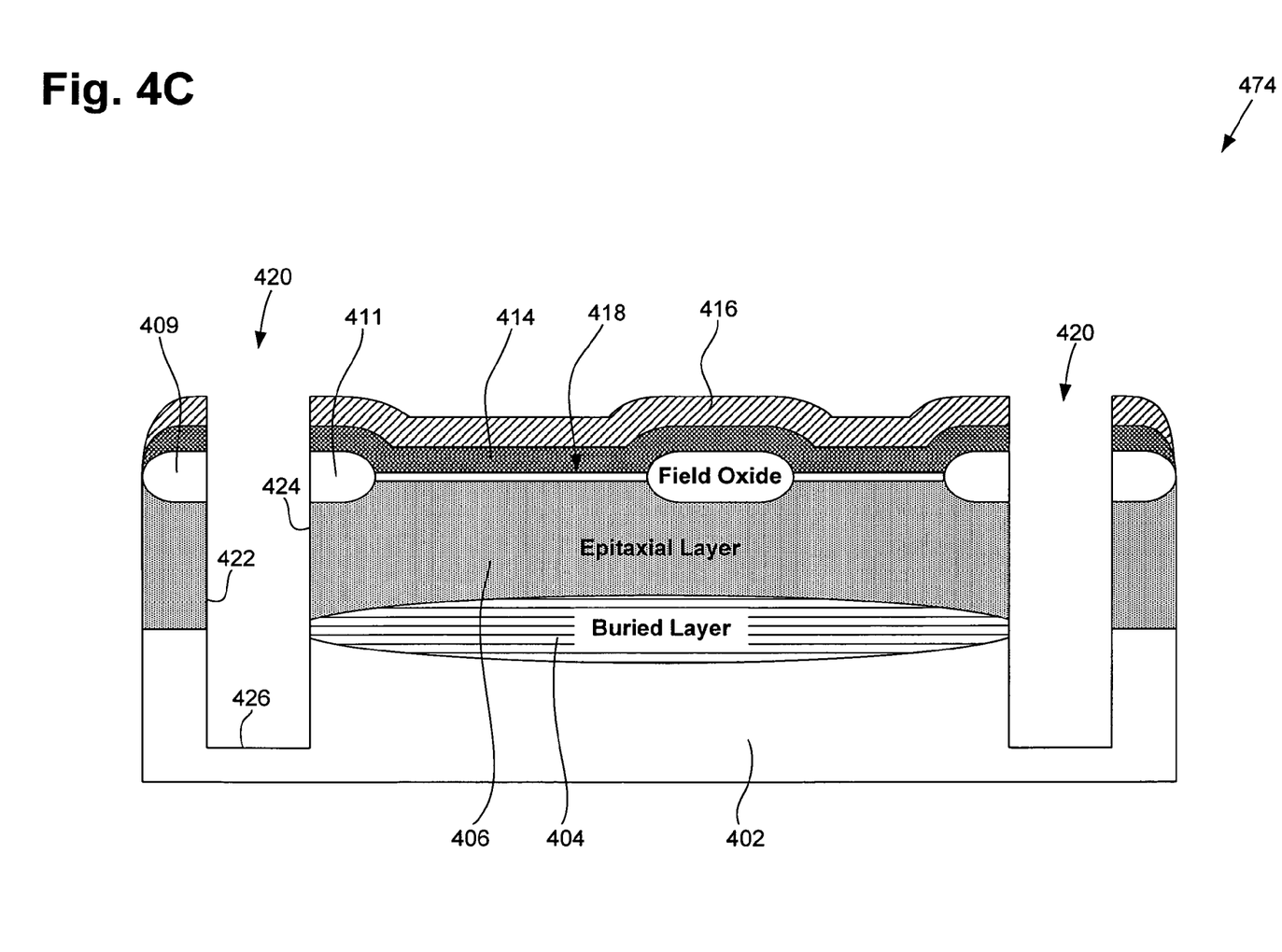
FIG. 4C illustrates a cross-sectional view, which includes a portion of a wafer processed according to an embodiment of the invention, corresponding to an intermediate step in the flowchart in FIG. 3.

Referring to step 374 in FIG. 3 and structure 474 in FIG. 4C, at step 374 of flowchart 300, hard mask 416 is utilized to perform a trench etch to define a final depth of trench 420. The trench etch can be performed by utilizing an appropriate etchant to etch silicon in epitaxial layer 406 to increase the depth of trench 420 to a final depth of, for example, approximately 7.0 microns. In one embodiment, the trench etch discussed above can be utilized to increase the depth of trench 420 to a final depth of between approximately 3.0 and approximately 7.0 microns. During the trench etch, a portion of hard mask 416 is also removed, which reduces the thickness of hard mask 416 by approximately one half. By way of example, hard mask 416 can be reduced from an initial thickness of approximately 4500.0 Angstroms to a thickness of approximately 2250.0 Angstroms as a result of the trench etch. After performance of the trench etch discussed above, a post trench clean can be performed by utilizing a diluted HF dip or other appropriate etchant to remove approximately 200.0 Angstroms of oxide from outside and inside walls 422 and 424 of trench 420. The result of step 374 of flowchart 300 is illustrated by structure 474 in FIG. 4C.

Figure 4D:
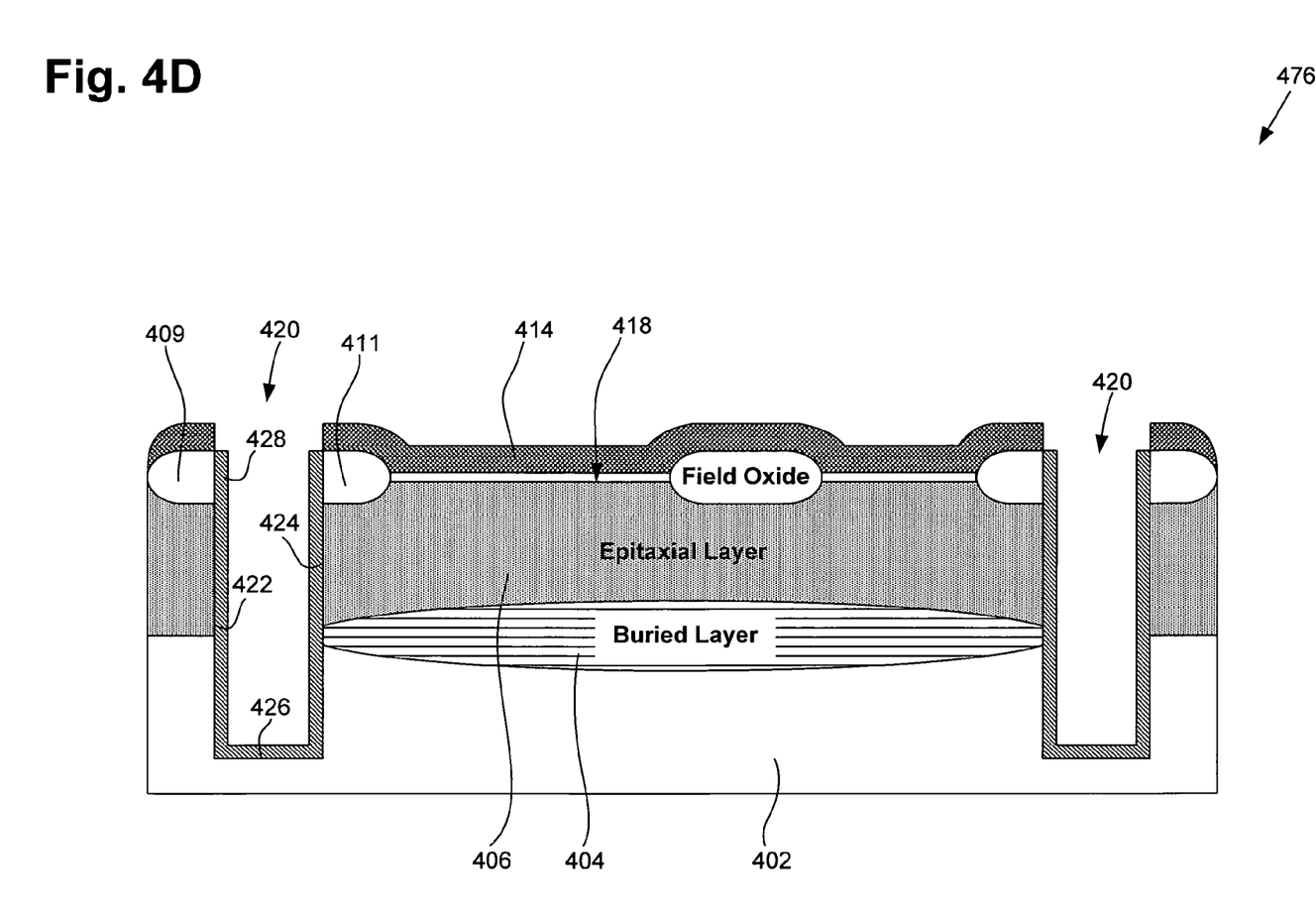
FIG. 4D illustrates a cross-sectional view, which includes a portion of a wafer processed according to an embodiment of the invention, corresponding to an intermediate step in the flowchart in FIG. 3.

Referring to step 376 in FIG. 3 and structure 476 in FIG. 4D, at step 376 of flowchart 300, hard mask 416 is removed, a channel stop implant is performed, and oxide liner 428 is thermally grown on outside and inside walls 422 and 424 and bottom surface 426 of trench 420 and over nitride layer 414 situated on substrate 402. In the present embodiment, hard mask 416 can be removed in an anisotropic dry etch process that is selective to silicon and nitride and utilizes an etchant such as C4F8/CO/Ar or other appropriate etchant. As a result of the high selectivity of the anisotropic dry etch process, the etchant does not significantly damage nitride layer 414 or silicon situated at bottom surface 426 of trench 420. By utilizing an anisotropic dry etch to remove hard mask 416, the present embodiment of the invention can maintain a uniform trench side width of approximately 1.0 micron, for example. In contrast, in a process utilizing a wet etch to remove hard mask 416, portions of field oxide 408 can be etched, which can undesirably alter the shape of trench 420. After removal of hard mask 416, outside and inside walls 422 and 424 of trench 420 can be cleaned by utilizing, for example, a plasma etch and an HF strip to remove polymer by-products formed on the outside and inside walls during etching of hard mask 416.

In the channel stop implant performed in step 376, a dopant such as boron, for example, can be implanted in bottom surface 426 of trench 420 to prevent current leakage. A wet strip can be performed to eliminate carbon and metal contamination resulting from the channel stop implant. Also, prior to thermally growing oxide liner 428, a thirty-second HF preclean can be performed to appropriately clean outside and inside walls 422 and 424 and bottom surface 426 of trench 420.

Next, oxide liner 428 is formed by thermally growing oxide on outside and inside walls 422 and 424 and bottom surface 426 of trench 420. The layer of thermal oxide can be densified by utilizing, for example, a temperature of approximately 750° C. and an inert gas such as nitrogen to complete formation of oxide liner 428. By way of example, oxide liner 428 can have a thickness of approximately 1000.0 Angstroms. Since oxide liner 428 comprises thermally grown oxide, oxide liner 428 is not formed on nitride layer 414 situated on top surface 418 of silicon substrate 402. By not forming oxide liner 428 on nitride layer 414, a buffered oxide etchant ("BOE") wet strip does not need to be performed in a subsequent step to remove oxide liner 428. As a result, field oxide lateral etching or undercutting caused by a BOE wet strip is eliminated, thereby providing a substantially flat final topography over a subsequently formed deep trench isolation region. The result of step 376 of flowchart 300 is illustrated by structure 476 in FIG. 4D.

Figure 4E:
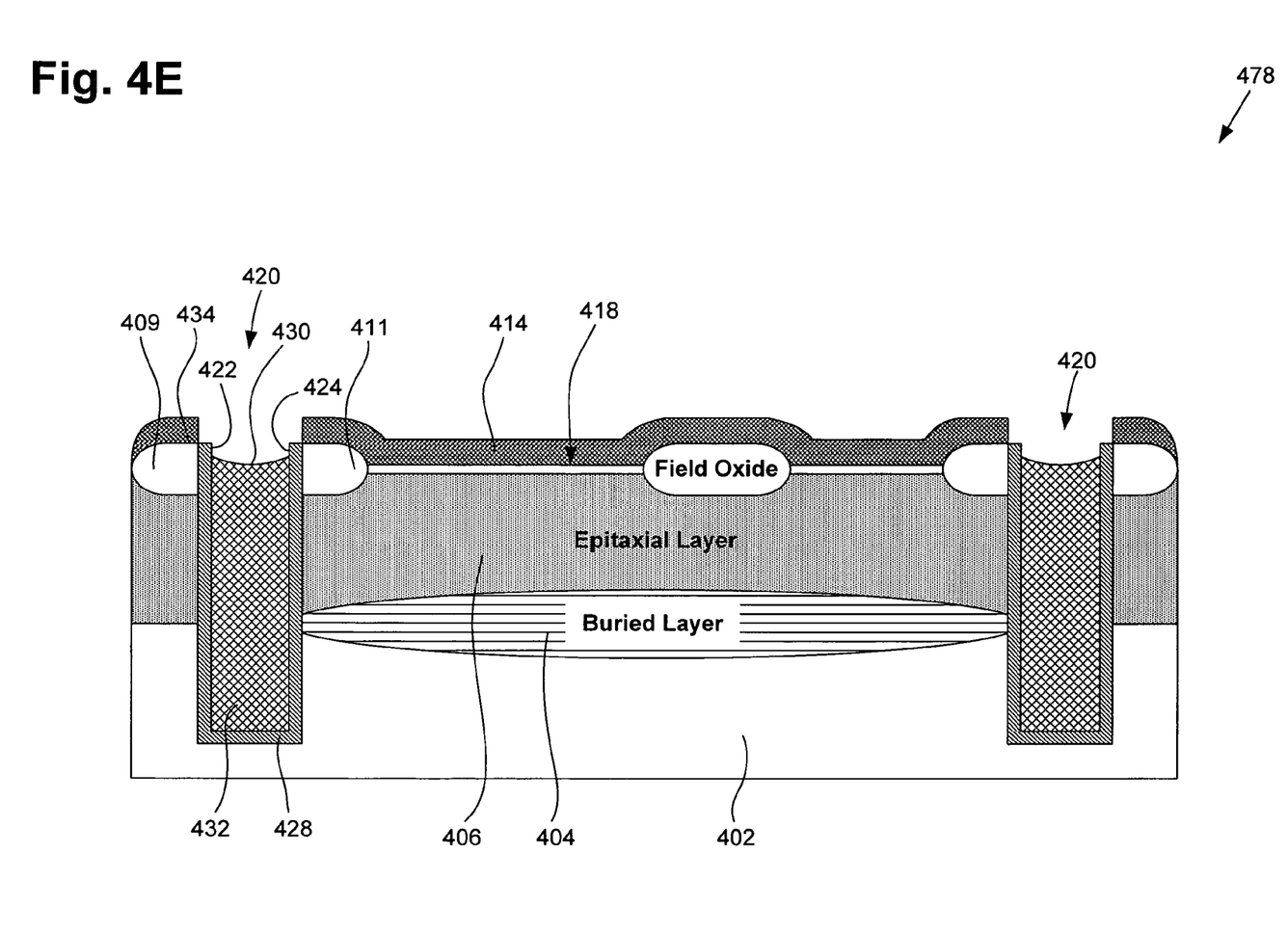
FIG. 4E illustrates a cross-sectional view, which includes a portion of a wafer processed according to an embodiment of the invention, corresponding to an intermediate step in the flowchart in FIG. 3.

Referring to step 378 in FIG. 3 and structure 478 in FIG. 4E, at step 378 of flowchart 300, a layer of polysilicon is conformally deposited over substrate 402 to fill trench 420 and etched in an etch back process. As a result of forming trench chamfered corners to reduce the trench corner width of trench 420 to approximately 0.9 microns, the layer of polysilicon can be conformally deposited over substrate 402 at a reduced thickness of approximately 0.7 microns. In contrast, as discussed above, a polysilicon deposition thickness of approximately 1.5 microns is required to adequately fill conventional trench 108 in FIG. 1. By reducing the polysilicon deposition thickness from approximately 1.5 microns to approximately 0.7 microns, the invention achieves a significant increase in polysilicon fill process throughput and a significant increase in average time between polysilicon deposition furnace cleaning, which advantageously reduces manufacturing cost.

In the etch back process, a break-through etch is first performed utilizing, for example, a CF4 etch chemistry to break through an oxide skin that is usually formed on the layer of polysilicon. Next, a main etch is performed utilizing, for example, an SF6/O2 etch chemistry, followed by an over etch utilizing, for example, a Cl2/HBr etch chemistry. As a result of the etch back process discussed above, the layer of polysilicon is etched back to depth 430 inside trench 420 to form polysilicon filling 432, which corresponds to polysilicon filling 212 in FIG. 2. Depth 430 can be, for example, approximately 1500.0 Angstroms below interface 434, which is situated at a boundary of field oxide portion 409 (or field oxide portion 411) and nitride layer 414. Since the respective etch chemistries utilized to perform the main etch and the over etch discussed above are highly selective to oxide, minimal etching of oxide liner 428 occurs during the polysilicon etch back process. The result of step 378 of flowchart 300 is illustrated by structure 478 in FIG. 4E.

Figure 4F:
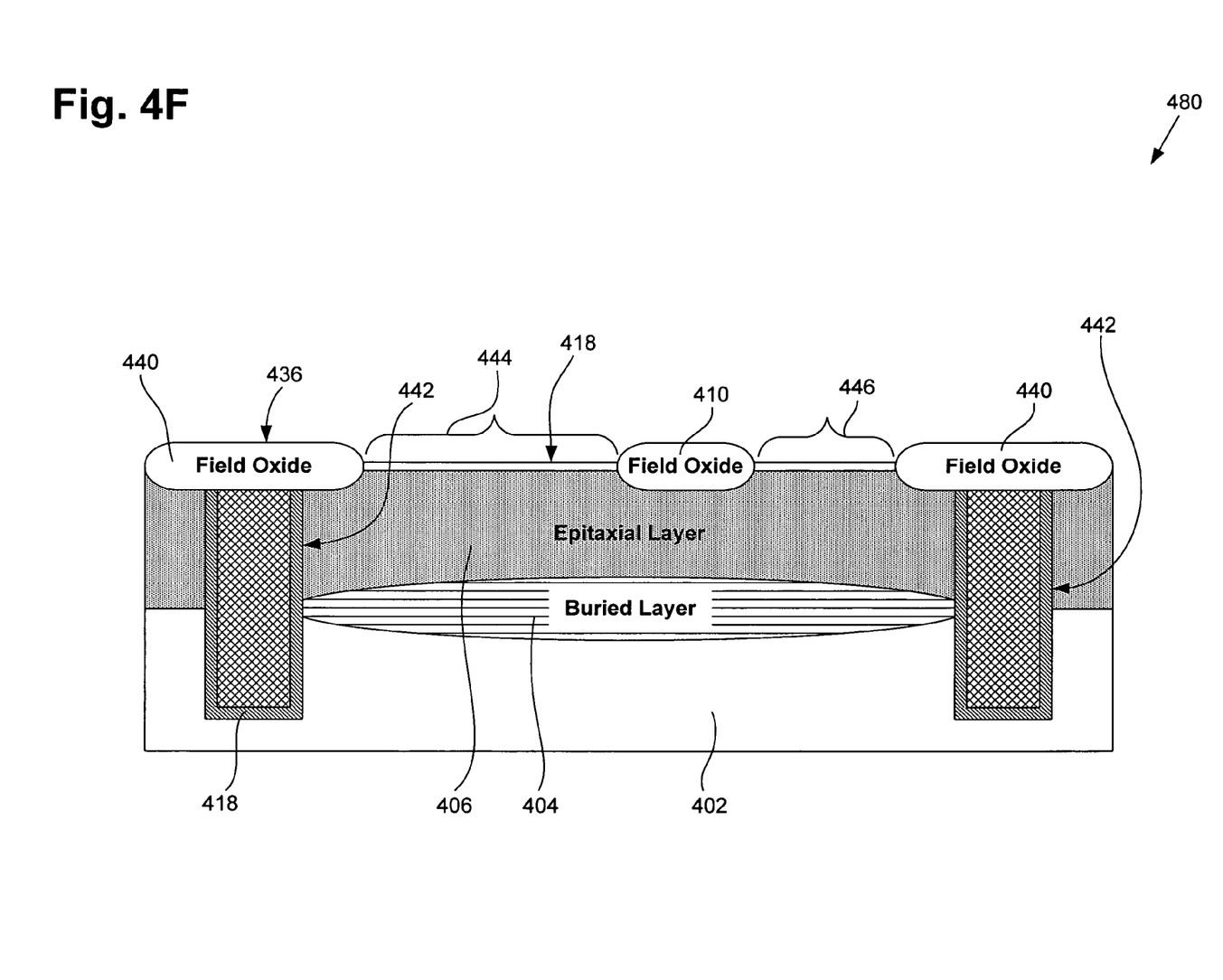
FIG. 4F illustrates a cross-sectional view, which includes a portion of a wafer processed according to an embodiment of the invention, corresponding to a final step in the flowchart in FIG. 3.

Referring to step 380 in FIG. 3 and structure 480 in FIG. 4F, at step 380 of flowchart 300, oxide is grown inside trench 420 to form continuous field oxide region 440 and nitride layer 414 is removed. As a result, grown oxide in trench 420 merges with field oxide portions 409 and 411 to form continuous field oxide region 440. By way of example, field oxide region 440 can have a thickness of approximately 4100.0 Angstroms. Since substantially no lateral etching occurs in field oxide portions 409 and 411, substantially no cavities are formed on top surface 436 of field oxide region 440, which is formed when field oxide portions 409 and 411 are joined by oxide grown in trench 420. Nitride layer 414 (shown in FIGS. 4A through 4E) can be removed by utilizing a phosphoric etch process or other appropriate etch process as known in the art.

Thus, as a result of the above processing steps, deep trench isolation region 442, which corresponds to deep trench isolation region 208 in FIG. 2, is formed underneath field oxide region 440. A bipolar device, such as bipolar device 204 in FIG. 2 can be formed in active regions 444 and 446 in FIG. 4F. For example, emitter 214 of bipolar device 204 can be formed in active region 444 and collector 218 of bipolar device 204 can be formed in active region 446. Thus, deep trench isolation region 442 can electrically isolate a bipolar device formed in active regions 444 and 446 from adjacent bipolar devices.

Thus, as discussed above, the present invention provides a deep trench isolation region with trench chamfered corners, which significantly reduce trench corner width. As a result, the invention's deep trench isolation region significantly increases polysilicon fill process throughput and the average time between polysilicon deposition furnace cleaning, thereby advantageously reducing manufacturing cost. It is understood to those of ordinary skill in the art that although the invention has been described in reference to a "wafer," such wafer can be diced and singulated into individual dies and thereafter packaged using various semiconductor packaging techniques and processes. As such, the invention is manifestly applicable to fabricating wafers and/or dies, which may or may not be later packaged, in accordance with the teachings of the invention as described above.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, deep trench isolation and method for forming same have been described.

The invention claimed is:

1. A semiconductor die including at least one deep trench isolation region for isolating an electronic device, said at least one deep trench isolation region comprising:
   a trench situated in a substrate of said semiconductor die, said trench having a plurality of sides surrounding said electronic device, and at least one trench chamfered corner formed between and connecting said plurality of sides;
   wherein said at least one trench chamfered corner causes a reduction in a thickness of a polysilicon layer within said trench.

2. The semiconductor die of claim 1, wherein a trench corner width at said at least one trench chamfered corner is less than a trench side width along said plurality of sides.

3. The semiconductor die of claim 1, wherein said at least one trench chamfered corner comprises a portion of said trench situated between a chamfered corner of an outside wall of said trench and a corner of an inside wall of said trench.

4. The semiconductor die of claim 1, wherein a field oxide region overlies said trench.

5. The semiconductor die of claim 1, wherein said trench further comprises an oxide liner situated on an inside wall and an outside wall of said trench.

6. The semiconductor die of claim 2, wherein said trench side width along said plurality of sides is approximately 1.0 micron.

7. The semiconductor die of claim 1, wherein said semiconductor die is enclosed in a semiconductor package.

8. The semiconductor die of claim 1, wherein said electronic device is a bipolar transistor.

9. The semiconductor die of claim 1, wherein said electronic device is a silicon-germanium bipolar transistor.

10. A semiconductor die including at least one deep trench isolation region for isolating an electronic device, said at least one deep trench isolation region comprising:
    at least one trench situated in a substrate of said semiconductor die, said at least one trench having four sides surrounding said electronic device, wherein a respective one of four trench chamfered corners connects each pair of said four sides;
    each of said four trench chamfered corners causing a reduction in a thickness of a polysilicon layer within said at least one trench.

11. The semiconductor die of claim 10, wherein a trench corner width at each of said four trench chamfered corners is less than a trench side width along each of said four sides of said at least one trench.

12. The semiconductor die of claim 10, wherein said each of said four trench chamfered corners comprises a portion of said at least one trench situated between a respective chamfered corner of an outside wall of said at least one trench and a corner of an inside wall of said at least one trench.

13. The semiconductor die of claim 10, wherein a field oxide region overlies said at least one trench.

14. The semiconductor die of claim 10, wherein said at least one trench further comprises an oxide liner situated on an inside wall and an outside wall of said at least one trench.

15. The semiconductor die of claim 10, wherein said semiconductor die is enclosed in a semiconductor package.

16. The semiconductor die of claim 10, wherein said electronic device is a bipolar transistor.

17. The semiconductor die of claim 10, wherein said electronic device is a silicon-germanium bipolar transistor.

\* \* \* \* \*